United States Patent
Kang et al.

(10) Patent No.: US 7,884,458 B2
(45) Date of Patent: Feb. 8, 2011

(54) DECOUPLING CAPACITOR, WAFER STACK PACKAGE INCLUDING THE DECOUPLING CAPACITOR, AND METHOD OF FABRICATING THE WAFER STACK PACKAGE

(75) Inventors: Sun-Won Kang, Seoul (KR); Seung-Duk Baek, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 363 days.

(21) Appl. No.: 11/935,953

(22) Filed: Nov. 6, 2007

(65) Prior Publication Data
US 2008/0116558 A1 May 22, 2008

(30) Foreign Application Priority Data
Nov. 21, 2006 (KR) .................. 10-2006-0115428

(51) Int. Cl.
*H01L 23/02* (2006.01)
(52) U.S. Cl. .................. 257/686; 257/E23.174; 257/E21.598
(58) Field of Classification Search .......... 257/686, 257/E23.174, E21.598
See application file for complete search history.

(56) References Cited

U.S. PATENT DOCUMENTS

| | | | |
|---|---|---|---|
| 6,943,294 B2 | 9/2005 | Kang et al. | |
| 2002/0025623 A1* | 2/2002 | Yamamichi et al. | 438/239 |
| 2004/0251529 A1* | 12/2004 | Lee et al. | 257/686 |

FOREIGN PATENT DOCUMENTS

| | | |
|---|---|---|
| JP | 2005-340555 | 12/2005 |
| KR | 2000-0053364 | 8/2000 |
| KR | 2006-0026434 | 3/2006 |

OTHER PUBLICATIONS

English language abstract of Japanese Publication No. 2005-340555.
English language abstract of Korean Publication No. 2006-0026434.

* cited by examiner

*Primary Examiner*—Leonardo Andújar
(74) *Attorney, Agent, or Firm*—Muir Patent Consulting, PLLC

(57) ABSTRACT

A decoupling capacitor, a wafer stack package including the decoupling capacitor, and a method of fabricating the wafer stack package are provided. The decoupling capacitor may include a first electrode formed on an upper surface of a first wafer, a second electrode formed on a lower surface of a second wafer, and an adhesive material having a high dielectric constant and combining the first wafer with the second wafer. In the decoupling capacitor the first and second electrodes operate as two electrodes of the decoupling capacitor, and the adhesive material operates as a dielectric of the decoupling capacitor.

20 Claims, 8 Drawing Sheets

DECOUPLING CAPACITOR, WAFER STACK PACKAGE INCLUDING THE DECOUPLING CAPACITOR, AND METHOD OF FABRICATING THE WAFER STACK PACKAGE

CROSS-REFERENCE TO RELATED PATENT APPLICATION

This application claims the benefit of Korean Patent Application No. 10-2006-0115428, filed on Nov. 21, 2006, in the Korean Intellectual Property Office, the disclosure of which is incorporated herein by reference.

BACKGROUND

1. Field of the Invention

The present invention relates to a semiconductor device and a method of fabricating the same, and more particularly, to a decoupling capacitor formed in a semiconductor device, a semiconductor package including the decoupling capacitor, and a method of fabricating the semiconductor package.

2. Description of the Related Art

The integration of semiconductor packages mounted in electronic systems has increased in line with the integration of electronic systems. To obtain higher integration in the same area, semiconductor devices are perpendicularly stacked in addition to using a 2-dimensional plane mounting structure. Wire bonding has been generally used as a package assembling method and methods of perpendicularly stacking wafers on which semiconductor devices are formed, i.e., semiconductor chips, and electrically connecting the semiconductor devices to external power sources, etc, have been intensively researched.

FIG. 1 is a cross-sectional view of a conventional wafer stack package (WSP) having perpendicular vias. Referring to FIG. 1, in the conventional WSP or a chip stack package (CSP) having perpendicular vias, a wafer 20 is stacked on a printed circuit board (PCB) 10 using an adhesive 30. A semiconductor in the wafer 20 is electrically connected to an external source through perpendicular vias 40. In other words, the perpendicular vias 40 are connected to internal wires of the PCB 10 and conductive bumps 50 formed underneath the PCB 10, e.g., solder balls, and to a plurality of power sources, a plurality of signals, and a plurality of ground terminals of a system in which the conventional wafer stack package is mounted through the solder balls.

A method of forming the wafer stack package will now be described in brief. Pad parts or redistribution pad parts of the wafer 20 are perforated using a mechanical or chemical method to form via holes. Next, the via holes are filled with a conductive metal using a plating method or another method to form the perpendicular vias 40. The wafers 20, in which the perpendicular vias 40 are formed, are stacked with the adhesive 30 positioned between the wafers 20 using thermocompression or the like, and mounted on a PCB 10 or the like. Here, the coupling of perpendicular vias is achieved using conductive bumps. The adhesive 30 used for connecting the wafers 20 in the wafer stack package, however, remains as an unnecessary area in terms of electrical performance characteristics.

FIG. 2 is a plan view illustrating an arrangement structure of the vias 40 in the conventional wafer stack package of FIG. 1. Referring to FIG. 2, in a wafer stack package structure using the perpendicular vias 40, semiconductor devices in stacked semiconductor chips are generally connected to signals, power sources, and ground terminals. The semiconductor devices are connected to external power sources, external signal sources, and external grounds through perpendicular vias formed in outer ends of the semiconductor chips, e.g., power vias 42 for connections to the power sources, ground vias 44 for connections to the grounds, and signal vias 46 for connections to signals. Such vias may be formed in different shapes, different positions, or different arrangements. If necessary, different types of power vias may be distinguishably formed. If a plurality of signals are required, a plurality of signal vias may be formed so that the number of signal vias is equal to the number of signals.

Factors such as noise, signal delay, etc., affect a high speed operation of a semiconductor device in such a semiconductor package. In particular, when the number of signals simultaneously transmitted to a semiconductor device is high, such signals are coupled to parasitic inductance components of a board on which a semiconductor package is mounted and thus include noise. Such noise is generally referred to as power and ground noise.

As the operation speed of the semiconductor devices and the number of simultaneously transmitted signals has increased, the power and ground noise has also increased, which impedes the high speed operation of the semiconductor device. To address this problem, methods of designing power and ground paths to have lower inductances and adding a decoupling capacitor to a surface of a board, etc., to stabilize the power and ground voltages have been suggested.

In the latter method, a resistance and an inductance must be "0." However, the effects of attempting to stabilize the power and the ground voltages by stabilizing the power and the ground voltages obtained by the decoupling capacitor are not very great due to a conductor path from a semiconductor device to the decoupling capacitor and internal equivalent series resistor (ESR) and equivalent series inductance (ESL) components of the decoupling capacitor.

SUMMARY

Embodiments of the present invention provide a decoupling capacitor capable of maximizing an effect of stabilizing power and ground voltages, a wafer stack package including the decoupling capacitor, and a method of fabricating the wafer stack package.

According to an embodiment of the present invention, a decoupling capacitor includes a first electrode formed on an upper surface of a first wafer, a second electrode formed on a lower surface of a second wafer, and an adhesive material having a high dielectric constant. The adhesive material attaches the first wafer to the second wafer. In the decoupling capacitor the first and second electrodes operate as electrodes of the decoupling capacitor, and the adhesive material operates as a dielectric of the decoupling capacitor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Figure 1:
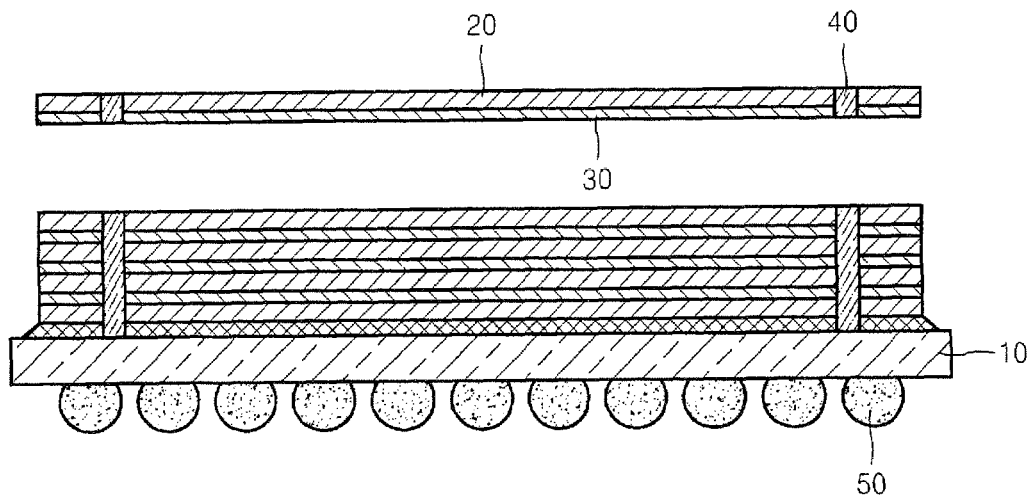
FIG. 1 is a cross-sectional view of a conventional wafer stack package having perpendicular vias.
Figure 2:
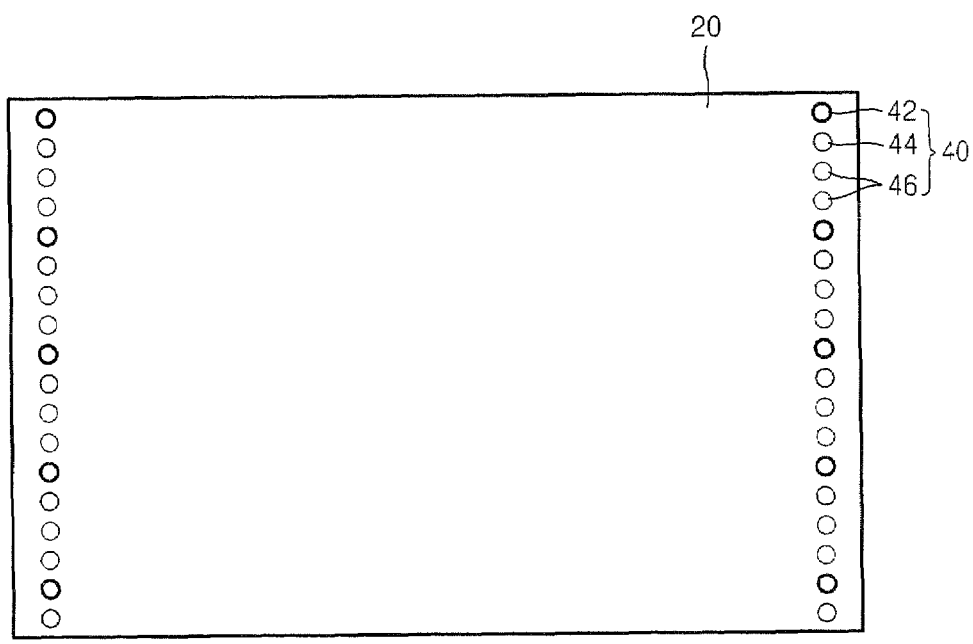
FIG. 2 is a plan view illustrating an arrangement structure of the perpendicular vias in the conventional wafer stack package illustrated in FIG. 1.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted.

Figure 3:
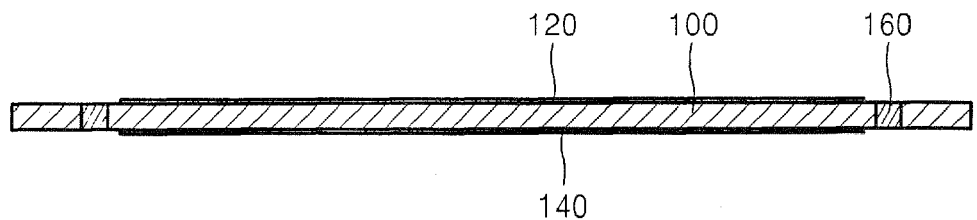
FIG. 3 is a cross-sectional view of a wafer for forming a decoupling capacitor according to an embodiment of the present invention.

FIG. 3 is a cross-sectional view of a wafer for forming a decoupling capacitor between wafers according to an embodiment of the present invention. Referring to FIG. 3, a first electrode thin film 120 is formed on an upper surface of a wafer 100 for forming a decoupling capacitor between wafers, and a second electrode thin film 140 is formed on a lower surface of the wafer 100. The first electrode thin film 120 may be a power electrode layer connected to a power source of a semiconductor device formed in the wafer 100, and the second electrode thin film 140 may be is a ground electrode layer connected to a ground of the semiconductor device. The positions of the power electrode 120 and the ground electrode layer 140 may be reversed. However, as shown in FIGS. 5 and 6, when several wafers are stacked, different electrodes must be formed on surfaces of the wafers facing each other in order to form decoupling capacitor between the wafers.

The power electrode layer 120 and the ground electrode layer 140 may be formed using various methods such as a deposition method used for forming the metal layers of a semiconductor device, a plating method, etc. Also, the power electrode layer 120 and the ground electrode layer 140 may be electrically connected to perpendicular vias 160. The perpendicular vias 160 may include power vias for connections to power sources, signal vias for connections to signals, and ground vias for connections to grounds. In the present embodiment, the power electrode layer 120 is connected to the power vias, and the ground electrode layer 140 is connected to the ground vias.

Figure 4A:
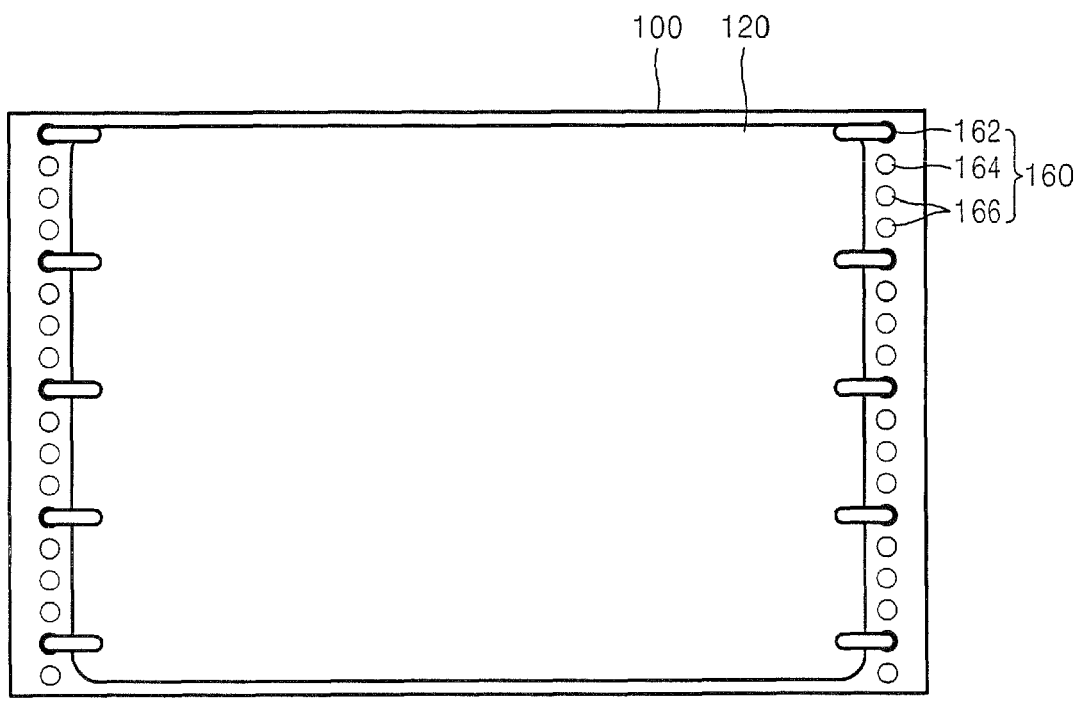
FIGS. 4A and 4B are plan views illustrating upper and lower surfaces of the wafer illustrated in FIG. 3.
Figure 4B:
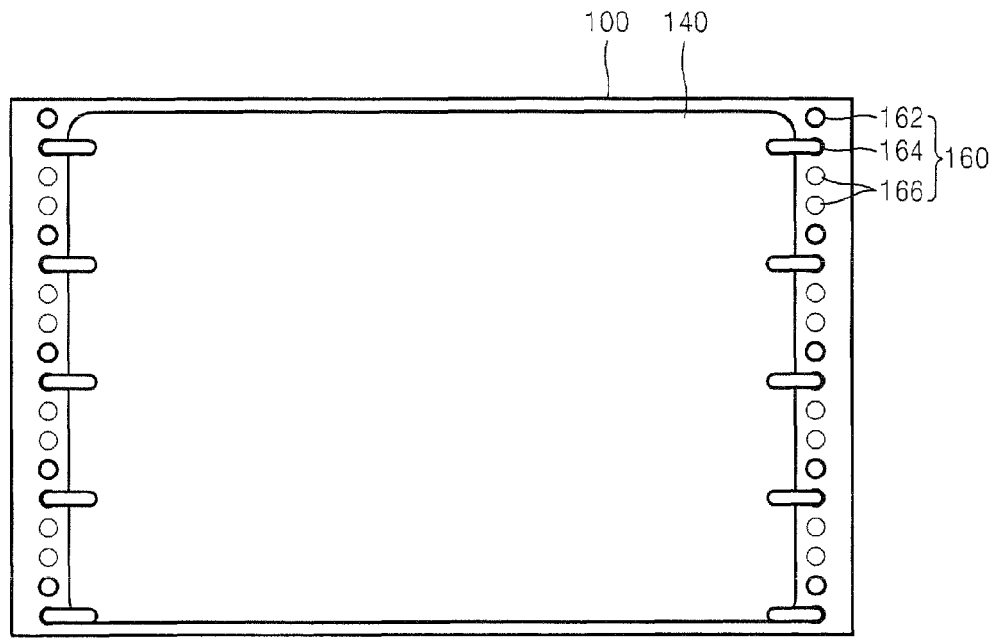

FIGS. 4A and 4B are plan views illustrating upper and lower surfaces of the wafer 100 illustrated in FIG. 3. Referring to FIG. 4A, the power electrode layer 120 is formed on the upper surface of the wafer 100 except a portion of the upper surface in which the perpendicular vias 160 are formed. Power vias 162 from among the perpendicular vias 160 are connected to the power electrode layer 120.

Referring to FIG. 4B, the ground electrode layer 140 is formed on the lower surface of the wafer 100 and connected to ground vias 164 from among the perpendicular vias 160. Here, two vias positioned under each of the ground vias 164 are signal vias 166 for signal connections with circuits housed in the semiconductor device.

As will be described with reference to FIGS. 5 and 6, the power electrode layer 120 and the ground electrode layer 140 may be formed on approximately on the entire surface of a wafer to maximize a capacitance of a decoupling capacitor, which in turn improves the function of the decoupling capacitor. In the current embodiment of the present embodiment, the power vias 162 and the ground vias 164 are formed on an outer end of the wafer. However, in other embodiments, power and ground vias 162, 164 may be formed on any portion of the wafer 100. For example, power and ground vias 162, 164 may be formed in a center of a wafer, and a power electrode layer 120 and a ground electrode layer 140 may be connected to an external power source and a ground through the power and ground vias. However, if the power and ground vias are formed in the center of the wafer, the ground vias may be insulated from the power electrode layer, and the power vias may be insulated from the ground electrode layer using an insulating layer (not shown).

Figure 4C:
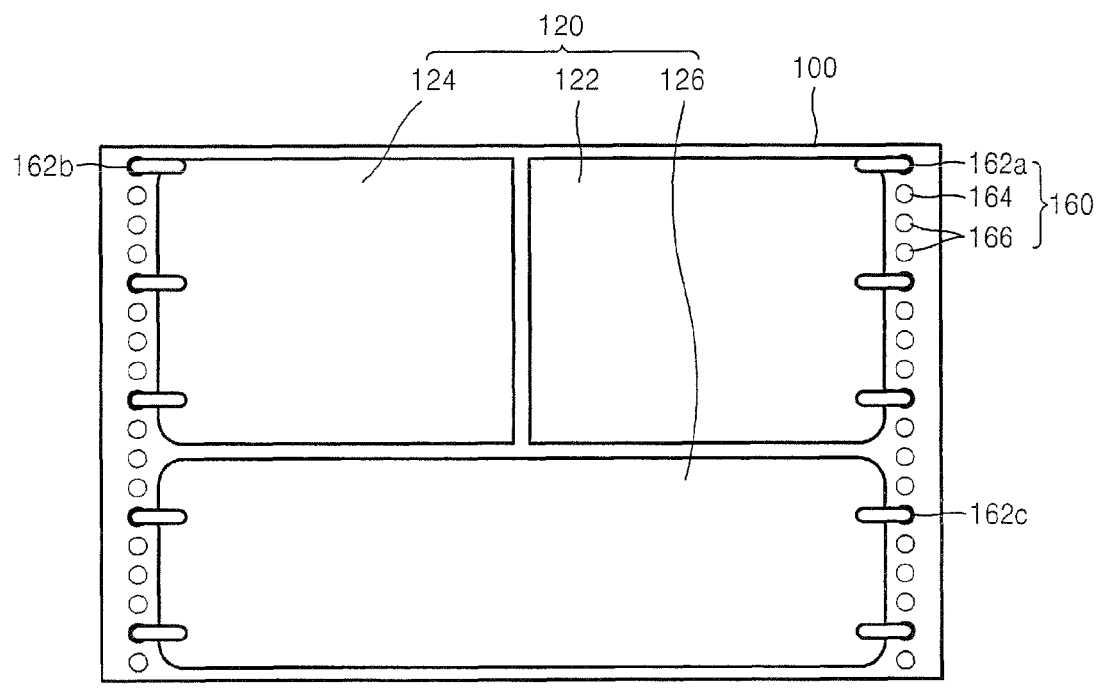
FIG. 4C is a plan view illustrating an upper surface of a wafer on which a power electrode having a different structure from the structure illustrated in FIG. 4A is formed.

FIG. 4C is a plan view illustrating an upper surface of a wafer on which a power electrode having a different structure from the structure illustrated in FIG. 4A is formed. Referring to FIG. 4C, a power electrode layer 120 is divided into separate sub-power electrode layers 122, 124, and 126. In this case, semiconductor devices formed on a wafer may use different power sources. If a plurality of power sources are required in a wafer, i.e., a semiconductor chip, sub-power vias 162a, 162b, and 162c may be formed for respectively connecting the sub-power electrode layers 122, 124, and 126 to the plurality of power sources. In other words, the first sub-power electrode layer 122 may be connected to the first sub-power via 162a, the second sub-power electrode layer 124 may be connected to the second sub-power via 162b, and the third sub-power electrode layer 126 may be connected to the third sub-power via 162c. The sub-power electrode layers 122, 124, and 126 must usually be insulated from one another.

In the present embodiment, the power electrode layer 120 is divided in an exemplary form. However, the power electrode layer 120 may be divided in various forms depending on a type of a semiconductor device or a kind of power sources required. Even if the power electrode layer 120 is divided as described above, the power electrode layer 120 may be formed to cover as much of the surface of the wafer 100 as possible to increase an effect of the decoupling capacitor.

Figure 5A:
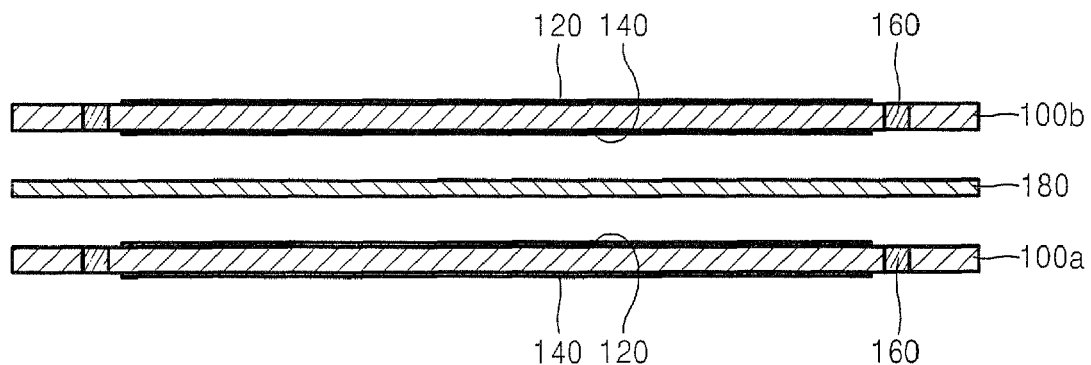
FIGS. 5A and 5B are cross-sectional views illustrating a decoupling capacitor according to another embodiment of the present invention.
Figure 5B:
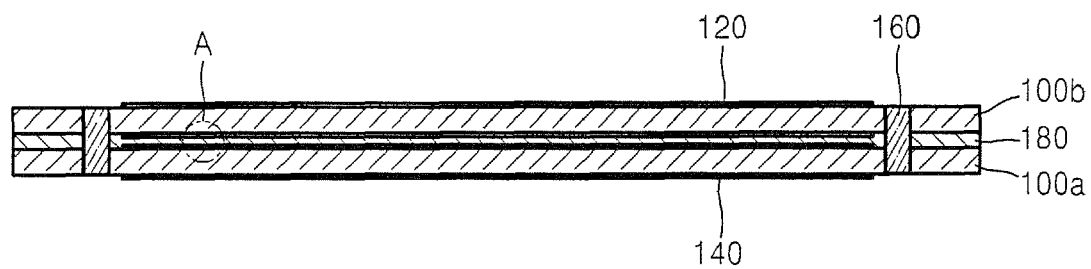

FIGS. 5A and 5B are cross-sectional views illustrating a decoupling capacitor formed between wafers according to another embodiment of the present invention. FIG. 5A is an exploded cross-sectional view illustrating the elements of the decoupling capacitor (including the wafers illustrated in FIG. 4) that are not yet coupled together, and FIG. 5B is a cross-sectional view illustrating the completed decoupling capacitor coupled using the wafers illustrated in FIG. 4.

Referring to FIG. 5A, a power electrode layer 120 and a ground electrode layer 140 are respectively formed on upper and lower surfaces of each of first and second wafers 100a and 100b for forming a decoupling capacitor. An adhesive material 180 is interposed between the first and second wafers 100a and 100b to couple the first and second wafers 100a and 100b to each other. The adhesive material 180 is separated from the first and second wafers 100a and 100b in FIG. 5A, but may be formed during a manufacturing process on either or both of the upper surface of the first wafer 100a and the lower surface of the second wafer 100b.

The power electrode layers 120 are connected to power vias of perpendicular vias 160, and ground electrode layers 140 are connected to ground vias of the perpendicular vias 160. Thus, the power electrode layer 120 of the first wafer 100a and the ground electrode layer 140 of the second wafer 100b operate as two electrodes of a capacitor, and the adhesive material 180 operates as a dielectric of the capacitor.

When two wafers are stacked, electrode layers may not be formed on the lower surface of the first wafer 100a and the upper surface of the second wafer 100b. Also, electrode layers on the upper surface of the first wafer 100a and the lower surface of the second wafer 100b face each other with the adhesive material 180 interposed therebetween. If the electrodes are connected to different electrodes, i.e., power and ground electrodes, their positions may be changed with each other. If devices formed on each of the two wafers use different power sources, a power electrode layer may be divided as shown in FIG. 4C.

Referring to FIG. 5B, the first and second wafers 100a and 100b are combined with each other using the adhesive material 180. The combination between the first and second wafers 100a and 100b is achieved using a thermocompression method to apply heat to adhere the two wafers to each other. In some embodiments, the thermocompression method includes applying sufficient heat to at least partially melt the adhesive material 180 interposed between the first wafer 100a and the second wafer 110b. The perpendicular vias 160 are electrically connected to one another. Thus, the perpendicular vias 160 between the first and second wafers 100a and 100b are connected to one another through conductive bumps, e.g., solder balls.

Figure 5C:
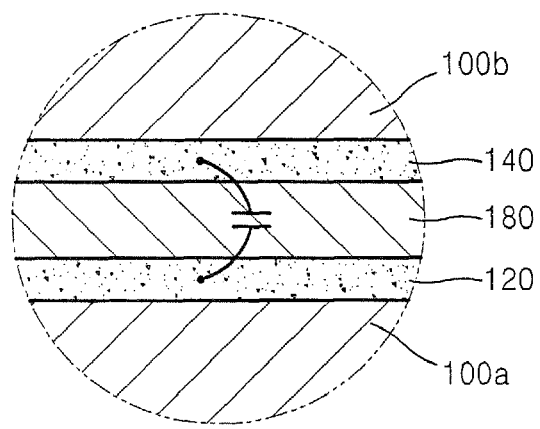
FIG. 5C is an enlarged cross-sectional view of portion A shown in FIG. 5B.

FIG. 5C is an enlarged cross-sectional view of portion A of FIG. 5B. Referring to FIG. 5C, the power electrode layer 120 on the upper surface of the first wafer 110a and the ground electrode layer 140 on the lower surface of the second wafer 100b operate as the two electrodes of a capacitor, and the adhesive material 180 between the two electrodes operate as a dielectric of a capacitor. As a result, a decoupling capacitor is completed. The adhesive material 180 functioning as the dielectric may have a high dielectric constant to increase the capacitance of the decoupling capacitor. For example, the adhesive material 180 may be formed of a material including $BaTiO_3$ or $SrTiO_3$. Also, if the combination between the two wafers can be firmly maintained, a thickness of the adhesive material 180 may be relatively thin.

The adhesive material 180 may have a single structure (i.e., one of a high dielectric adhesive material) or may have a multilayer structure in which one or more adhesive materials are adhered on top of and underneath a high dielectric material.

Two electrodes having thin plate shapes can be formed on the wafers, and an adhesive material remaining as an unnecessary part can be used as a dielectric of a capacitor so as to form a decoupling capacitor between wafers in a package to a minimum size. Also, the decoupling capacitor can be formed adjacently to a semiconductor device. Thus, ESR and ESL problems can be effectively overcome to considerably improve stabilization efficiencies of power and ground voltages.

Figure 6A:
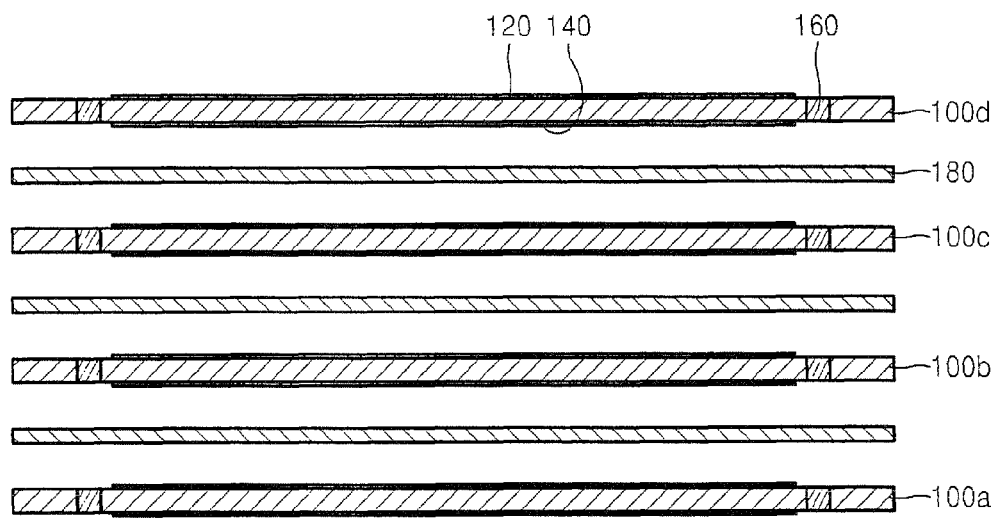
FIGS. 6A and 6B are cross-sectional views illustrating decoupling capacitors according to another embodiment of the present invention.
Figure 6B:
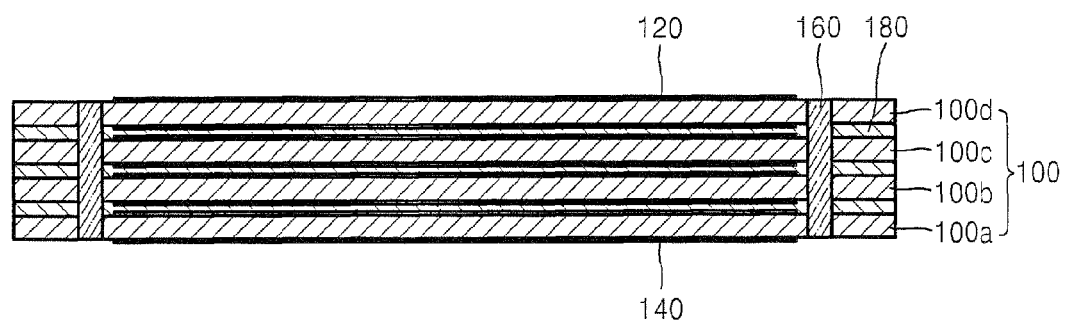

FIGS. 6A and 6B are cross-sectional views illustrating decoupling capacitors formed among wafers according to another embodiment of the present invention. FIG. 6A is an exploded cross-sectional view illustrating elements of a plurality of decoupling capacitors that are not combined with one another, and FIG. 6B is a cross-sectional view illustrating the plurality of decoupling capacitors when they are combined with one another. Referring to FIGS. 6A and 6B, four wafers are stacked to form three decoupling capacitors among the four wafers. However, the number of stacked wafers and decoupling capacitors may be more or less than the numbers illustrated in FIGS. 6A and 6B.

Referring to FIG. 6A, a power electrode layer 120 and a ground electrode layer 140 are respectively formed on upper and lower surfaces of each of wafers 100a, 100b, 100c, and 100d for forming decoupling capacitors. Also, adhesive materials 180 having high dielectric constants are positioned among the wafers 100a, 100b, 100c, and 100d to combine the wafers 100a, 100b, 100c, and 100d with one another.

The power electrode layers 120 are connected to power vias from among perpendicular vias 160, and the ground electrode layers 140 are connected to ground vias of the perpendicular vias 160. Thus, three decoupling capacitor may be formed among the four wafers. Electrode layers on the lower surface of the wafer 100a and the upper surface of the wafer 100d may be omitted. In addition, if two electrode layers facing each other with the adhesive material 180 interposed therebetween are connected to different electrodes, i.e., power and ground electrodes, their positions may be changed with each other as described above.

Referring to FIG. 6B, the wafers 100a, 100b, 100c, and 100d are combined with one another via the adhesive materials 180 using a thermocompression method or the like. Also, the perpendicular vias 160 must be electrically connected to one another. Thus, the perpendicular vias 160 among the wafers 100a, 100b, 100c, and 100d are connected to one another using additional conductive bumps, e.g., solder balls.

In the present embodiment, the three decoupling capacitors are formed using the four wafers. However, the present invention is not limited to this. As mentioned above, various numbers of decoupling capacitors may be formed depending on the number of wafers necessary for forming a package. Also, if devices formed on wafers use different power sources, a power electrode layer may be formed in a divided form as shown in FIG. 4C.

Figure 7:
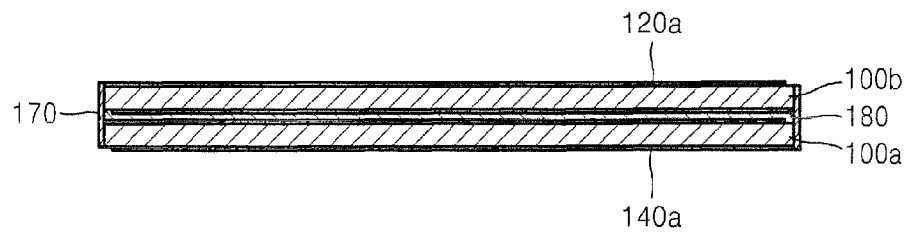
FIG. 7 is a cross-sectional view illustrating a decoupling capacitor according to another embodiment of the present invention.

FIG. 7 is a cross-sectional view illustrating a decoupling capacitor formed between wafers according to another embodiment of the present invention. Referring to FIG. 7, the decoupling capacitor according to the present embodiment is formed to have a similar structure to that illustrated in FIG. 5. In other words, a power electrode layer 120a and a ground electrode layer 140a are respectively formed on an upper surface of a wafer 100a and a lower surface of a wafer 110b and operate as the two electrodes of the capacitor. Also, an adhesive material 180 positioned between the wafers 100a and 100b operates as a dielectric of the capacitor. However, the power electrode layer 120a and the ground electrode layer 140a are connected to external power source and ground not through perpendicular vias but through cut lines 170 of the wafers 100a and 100b. A cut line 170 is formed in the wafer to divide the wafer into individual dies. Electrode layers are electrically connected to a power source or a ground through such cut lines.

When the decoupling capacitor is formed as in the present embodiment, areas of electrode layers may be further extended. Thus, a capacitance of the decoupling capacitor may be increased. As a result, power and ground voltages may be further stabilized.

Figure 8:
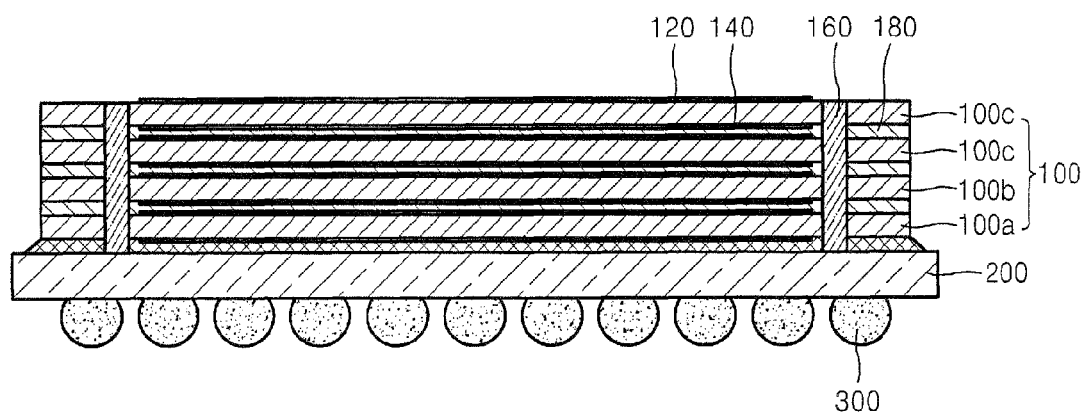
FIG. 8 a cross-sectional view a wafer stack package including a decoupling capacitor according to another embodiment of the present invention.

FIG. 8 a cross-sectional view a wafer stack package including a decoupling capacitor formed between wafers according to another embodiment of the present invention. Referring to FIG. 8, the wafer stack package according to the present embodiment includes a PCB 200, a wafer 100 formed above the PCB 200 and including a decoupling capacitor and conductive bumps 300 formed underneath the PCB 200. The conductive bumps 300 may be solder balls.

The wafer 100 stacked above the PCB 200 has a structure in which four wafers 100a, 100b, 100c, and 100d are stacked like the structure illustrated in FIG. 4. A power electrode layer 120 and a ground electrode layer 140 are respectively formed on upper and lower surfaces of each of the wafers 100a, 100b, 100c, and 100d. The power electrode layers 120 and the ground electrode layers 140 are respectively connected to power vias and ground vias of perpendicular vias 160. Combinations among the wafers 100a, 100b, 100c, and 100d may be achieved using adhesive materials 180 having a high dielectric constant that adhere the wafers to one another through, for example, a thermocompression method.

The wafer stack package of the present embodiment has a structure in which four wafers are stacked. However, a different number of wafers may be stacked. Also, when semiconductor devices use different power sources, a power electrode layer may be formed in a divided form (such as the one shown in FIG. 4C).

The wafer 100 including the decoupling capacitor may be connected to internal lines of the PCB 200 through the perpendicular vias 160. Alternatively, the wafer 100 may be connected to the internal lines using a general flip-chip bonding or wire bonding method.

In the wafer stack package of the present invention, decoupling capacitors are formed among wafers. Thus, additional decoupling capacitors do not need to be formed. Also, existing adhesive parts are used. Thus, an entire size of the wafer stack package can be reduced. In addition, the decoupling capacitors are formed at a relatively short distance from the semiconductor devices disposed on the wafers since they are adjacent to the wafers. Thus, ESR and ESL problems of the decoupling capacitors can be effectively solved to maximize stabilization efficiencies of power and ground voltages.

Figure 9A:
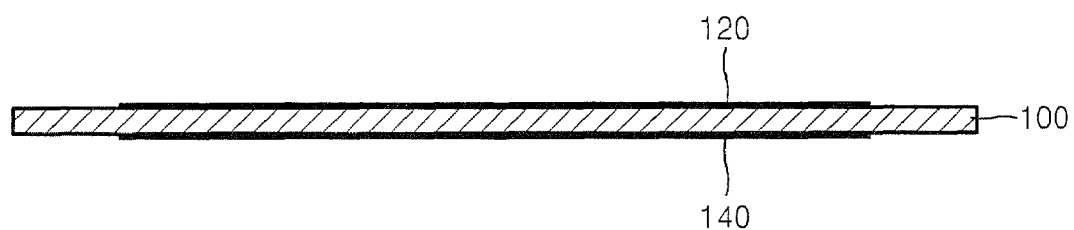
FIGS. 9A through 9E are cross-sectional views illustrating a method of fabricating a wafer stack package including a decoupling capacitor according to an embodiment of the present invention.

FIGS. 9A through 9E are cross-sectional views illustrating a method of fabricating a wafer stack package including decoupling capacitors formed between wafers according to an embodiment of the present invention. Referring to FIG. 9A, electrode layers 120 and 140 are formed on upper and lower surfaces of each of at least two wafers 100 on which semiconductor devices are formed. The electrode layers 120 and 140 may be formed using a deposition method, a plating method, etc. of forming metal layers of semiconductor devices.

Figure 9B:
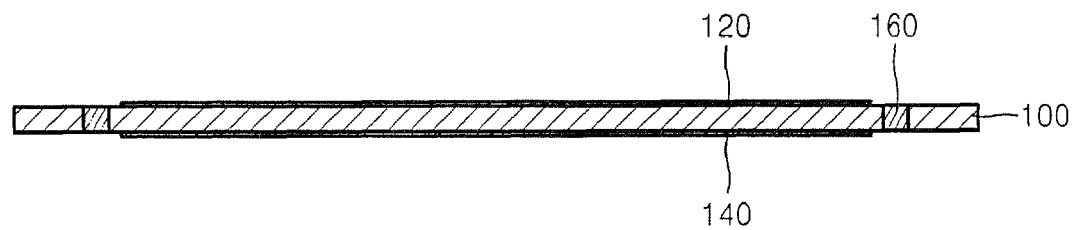

Referring to FIG. 9B, perpendicular vias 160 are formed in outer ends of the wafers 100. The wafers 100 may be pierced using a mechanical or chemical method and then filled with a conductive material using a plating method or a different method to form the perpendicular vias 160. Also, a process of connecting the electrode layers 120 and 140 to power and ground vias, respectively, may be performed during the formation of the perpendicular vias 160. In the present embodiment, the perpendicular vias 160 are formed in the outer ends of the wafers 100, but positions of the perpendicular vias 160 are not limited to the outer ends of the wafers 100.

Figure 9C:
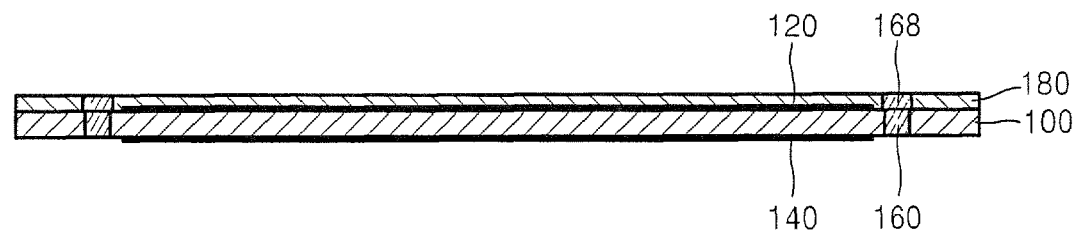

Referring to FIG. 9C, adhesive materials 180 are formed on the upper surfaces of the wafers 100. The adhesive material 180 functions as a dielectric of a capacitor and thus may be formed of a material having a high dielectric constant, such as a material including $BaTiO_3$, or $SrTiO_3$. Also, the adhesive materials 180 may have a multilayer structure in which one or more adhesives are adhered on top of and underneath a high dielectric material. Conductive bumps 168 are formed on the perpendicular vias 160 separately from the adhesive materials 180. This is because the perpendicular vias 160 in the wafers 100 must be electrically connected to one another.

Figure 9D:
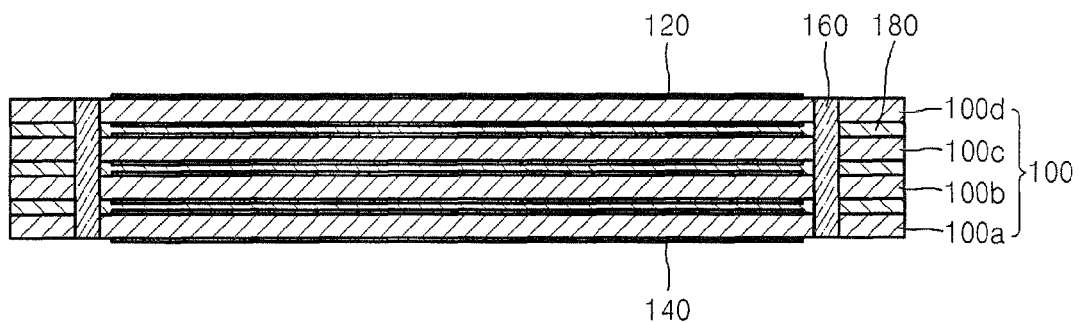

Referring to FIG. 9D, the wafers 100 are combined with one another to be stacked using a thermocompression method or the like. The perpendicular vias 160 are connected to one another through the conductive bumps 168.

Figure 9E:
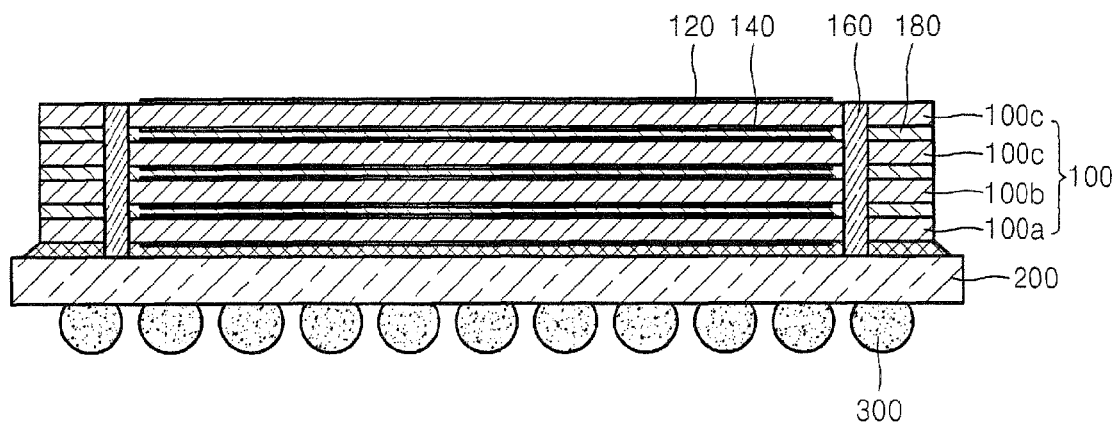

Referring to FIG. 9E, the wafer stack package is completed through processes of mounting the stacked wafers 100 on a PCB 200, sealing the wafers 100 using a sealant (not shown), and forming conductive bumps 300 underneath the PCB 200.

The method of the present embodiment further includes processes of forming electrode layers on upper and lower surfaces of each wafer and respectively connecting the electrode layers to corresponding vias of perpendicular vias plus an existing process of manufacturing the wafer stack package using the perpendicular vias. Thus, a conventional process of manufacturing a package may be used. Also, in the wafer stack package, a decoupling capacitor is formed between wafers as described above. Thus, the size of the wafer stack package can be reduced. Also, ESR and ESL problems can be solved to maximize stabilization efficiencies of power and ground.

As described above, a decoupling capacitor formed between wafers according to the present invention can use an adhesive part used for stacking the wafers as the dielectric of the capacitor. Thus, almost all surfaces of the wafers can be used to form the decoupling capacitor, which may advantageously increase the capacitance of the decoupling capacitor. Also, the decoupling capacitor can be formed adjacently to a semiconductor device. Thus, ESR and ESL problems can be solved. As a result, the decoupling capacitor can further effectively perform its function.

A wafer stack package according to the present invention can include the decoupling capacitor formed between the wafers and thus efficiently stabilizes power and ground voltages. An additional decoupling capacitor does not need to be formed. Thus, the size of the wafer stack package can be reduced.

A method of manufacturing the wafer stack package according to the present invention can use conventional processes of manufacturing a wafer stack package having a perpendicular via structure. Thus, the wafer stack package can be easily manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A decoupling capacitor, comprising:
   a first electrode formed on an upper surface of a first wafer;
   a second electrode formed on a lower surface of a second wafer; and
   an adhesive material having a high dielectric constant, the adhesive material adhering the first wafer and the second wafer together, wherein the first and second electrodes operate as two electrodes of the decoupling capacitor, and the adhesive material operates as a dielectric of the decoupling capacitor, and wherein conductive perpendicular vias are formed in the first and second wafers to connect semiconductor devices formed on the first and second wafers to signals, power sources, and grounds, and wherein the first electrode is connected to power vias configured to connect the semiconductor devices to the power sources, and the second electrode is connected to ground vias configured to connect the semiconductor devices to the grounds.

2. The decoupling capacitor of claim 1, wherein the first electrode is a conductive thin plane formed on the upper surface of the first wafer, and the second electrode is a conductive thin plane formed on the lower surface of the second wafer.

3. The decoupling capacitor of claim 2, wherein the conductive thin planes have forms suitable to maximize a capacitance of the decoupling capacitor.

4. The decoupling capacitor of claim 2, wherein the conductive thin planes are respectively formed on substantially the entire upper and lower surfaces of the first and second wafers except for connection parts for electrical connections to semiconductor devices formed on the first and second wafers.

5. The decoupling capacitor of claim 1, wherein the first and second electrodes are respectively formed on substantially the entire upper and lower surfaces of the first and second wafers except for parts in which the vias for connecting the semiconductor devices are formed, and wherein if the semiconductor devices formed on the first wafer use at least two different powers, the power vias are divided into sub-power vias connected to the at least two different power sources, the first electrode being electrically divided into sub-electrode areas corresponding to the semiconductor devices, where the divided sub-electrode areas of the first electrode are respectively connected to corresponding sub-power vias.

6. The decoupling capacitor of claim 1, wherein the perpendicular vias in the first and second wafers are connected to each other through conductive bumps.

7. The decoupling capacitor of claim 1, wherein a second electrode is formed on a lower surface of the first wafer, a first electrode is formed on an upper surface of the second wafer, and at least one other wafer is stacked on one of the first and second wafers to form at least two decoupling capacitors.

8. The decoupling capacitor of claim 7, wherein first and second electrodes are respectively formed on upper and lower surfaces of the at least one other wafer, and the at least one other wafer is stacked on one of the first and second wafers using the adhesive material.

9. The decoupling capacitor of claim 8,
wherein a semiconductor device is formed on the at least one other wafer,
wherein perpendicular vias are formed in the at least one other wafer to connect the semiconductor devices formed on the wafers to signals, the power sources, and the grounds are formed in the first, second, and at least one other wafer, and wherein first electrodes of the first, second, and at least one other wafer are connected to power vias to connect the semiconductor devices to the power sources, and second electrodes of the first, second, and at least one other wafer are connected to ground vias to connect the semiconductor devices to the grounds.

10. The decoupling capacitor of claim 1, wherein the adhesive material has one of a single structure comprising $BaTiO_3$ or $SrTiO_3$, and a multilayer structure in which adhesives are adhered on and underneath a high dielectric.

11. A wafer stack package comprising a decoupling capacitor, comprising:
a printed circuit board (PCB);
at least two wafers stacked on the PCB, wherein first electrodes are formed on first surfaces of the at least two wafers, and second electrodes are formed on second surfaces of the at least two wafers; and
an adhesive material having a high dielectric constant, the adhesive material adhering the at least two wafers together,
wherein one of the first and one of the second electrodes operate as electrodes of the decoupling capacitor, and the adhesive material operates as a dielectric of the decoupling capacitor to form the decoupling capacitor between the at least two wafers.

12. The wafer stack package of claim 11, wherein the first electrodes are conductive thin planes formed on the first surfaces of the at least two wafers, and the second electrodes are conductive thin planes formed on the second surfaces of the at least two second surfaces.

13. The wafer stack package of claim 11, wherein conductive perpendicular vias are formed in the at least two wafers to connect semiconductor devices formed on the at least two wafers to signals, power sources, and grounds, wherein the first electrodes are connected to power vias configured to connect the semiconductor devices to the power sources, and the second electrodes are connected to ground vias configured to connect the semiconductor devices to the grounds.

14. The wafer stack package of claim 13, wherein the first and second electrodes are respectively formed substantially over the entire surfaces of the at least two wafers except for parts in which the vias are formed, and wherein if semiconductor devices formed on at least one of the at least two wafers use at least two different power sources, the power vias are divided into sub-power vias connected to the at least two different power sources, the first electrodes formed on the at least one wafer being electrically divided into sub-electrode areas of the semiconductor devices, where the divided parts of the first electrodes are respectively connected to the corresponding sub-power vias.

15. The wafer stack package of claim 13, wherein the perpendicular vias are formed in outer end parts of the at least two wafers in which the semiconductor devices are formed.

16. The wafer stack package of claim 11, wherein the first electrodes are connected to power sources of semiconductor devices formed on the at least two wafers through die cut lines formed on the at least two wafers, and the second electrodes are connected to grounds of the semiconductor devices formed on the at least two wafers through the die cut lines on the at least two wafers.

17. The wafer stack package of claim 11, wherein the at least two wafers are electrically connected to an upper surface of the PCB using one of flip-chip bonding and wire bonding methods.

18. The wafer stack package of claim 17, wherein solder balls are formed on a bottom surface of the PCB, and the at least two wafers stacked on the PCB are sealed using a sealant.

19. A semiconductor device, comprising:
a first wafer having a first surface;
a second wafer having a second surface, wherein the second wafer is disposed over the first wafer such that the first surface of the first wafer faces the second surface of the second wafer;
a first electrode formed on the first surface of the first wafer;
a second electrode formed on the second surface of the second wafer; and
an adhesive material formed between the first and second electrode to adhere the first and second wafers together, wherein the first electrode, second electrode, and adhesive material are configured to operate as a decoupling capacitor, wherein the first wafer includes first semiconductor components and the second wafer includes second semiconductor components, and wherein each of the first and second wafers includes a plurality of vias respectively perpendicular to the first and second surfaces, the plurality of vias configured to connect the first and second semiconductor components to a power source, a ground, and communication signals.

20. The semiconductor device of claim 19, wherein the adhesive material comprises a high dielectric adhesive material.

* * * * *